United States Patent
Aramaki et al.

(10) Patent No.: US 10,037,909 B2
(45) Date of Patent: Jul. 31, 2018

(54) PLASMA PROCESSING APPARATUS

(71) Applicant: Hitachi High-Technologies Corporation, Minato-ku, Tokyo (JP)

(72) Inventors: Tooru Aramaki, Tokyo (JP); Michikazu Morimoto, Tokyo (JP); Kenetsu Yokogawa, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 373 days.

(21) Appl. No.: 14/626,911

(22) Filed: Feb. 19, 2015

(65) Prior Publication Data

US 2016/0079107 A1    Mar. 17, 2016

(30) Foreign Application Priority Data

Sep. 12, 2014   (JP) .................................. 2014-185851

(51) Int. Cl.
  *C23C 16/00* (2006.01)
  *C23F 1/00* (2006.01)
  *H01L 21/306* (2006.01)
  *H01L 21/683* (2006.01)
  *H01T 23/00* (2006.01)
  *H01J 37/32* (2006.01)

(52) U.S. Cl.
  CPC .... *H01L 21/6833* (2013.01); *H01J 37/32174* (2013.01); *H01J 37/32577* (2013.01); *H01J 37/32715* (2013.01)

(58) Field of Classification Search
  USPC ................ 118/728–730; 156/345.51–345.55; 361/234
  See application file for complete search history.

(56) References Cited

U.S. PATENT DOCUMENTS 4,842,683 A * 6/1989 Cheng ............... H01J 37/32431
                                                                  156/345.37
5,459,632 A * 10/1995 Birang ................ H01L 21/6831
                                                                  307/130

(Continued)

FOREIGN PATENT DOCUMENTS

JP        6-45285 A       2/1994
JP     2008-047657    *   2/2008

OTHER PUBLICATIONS

Machine Translation JP2008047657, Morita (Year: 2008).*

*Primary Examiner* — Rakesh Dhingra
(74) *Attorney, Agent, or Firm* — Miles & Stockbridge P.C.

(57) ABSTRACT

In a plasma processing apparatus, a connector section with the film-like electrode of a sintered plate of a sample stage to which high-frequency power is supplied includes a conductor section disposed inside a through hole, an upper part of which is bonded to the film-like electrode and a lower part of which is connected to an end of a power supply path of the high-frequency power, and a boss disposed between the conductor section and a substrate surrounding an outer periphery of the conductor section inside the through hole and made of an insulating material. Upper ends of a rod-like member at the center of the conductor section and a socket surrounding the rod-like member are disposed at a position higher than the boss, and an adhesive is prevented from entering between the socket and the rod-like member in the upper end of the socket.

9 Claims, 7 Drawing Sheets

(56) References Cited

U.S. PATENT DOCUMENTS

| | | | | |
|---|---|---|---|---|
| 5,801,915 A | * | 9/1998 | Kholodenko | C23C 16/45521 279/128 |
| 5,946,184 A | * | 8/1999 | Kanno | H01L 21/6833 279/128 |
| 6,072,685 A | * | 6/2000 | Herchen | H01L 21/6833 279/128 |
| 6,151,203 A | * | 11/2000 | Shamouilian | H01L 21/6833 361/234 |
| 7,045,045 B2 | * | 5/2006 | Natsuhara | H01L 21/6831 118/728 |
| 2002/0022403 A1 | * | 2/2002 | Cheng | H01L 21/6833 439/625 |
| 2003/0169553 A1 | * | 9/2003 | Brown | H02N 13/00 361/234 |
| 2005/0127619 A1 | * | 6/2005 | Tateno | H01L 21/67103 279/128 |
| 2007/0012559 A1 | * | 1/2007 | Hosokawa | C23C 14/35 204/192.1 |
| 2008/0212255 A1 | * | 9/2008 | Miyaji | H01L 21/6831 361/234 |
| 2013/0027838 A1 | * | 1/2013 | Hori | H01L 21/6833 361/234 |
| 2013/0180662 A1 | * | 7/2013 | Sato | H01J 37/32082 156/345.51 |

* cited by examiner

PLASMA PROCESSING APPARATUS

BACKGROUND OF THE INVENTION

The present invention relates to a plasma processing apparatus that performs an etching process of a wafer as a processing target mounted on a sample stage provided in a processing chamber disposed inside a vacuum chamber using a plasma generated in the processing chamber, or a plasma processing method. In particular, the present invention relates to a plasma processing apparatus that processes a sample while supplying high-frequency power to an electrode inside a sample stage onto which a substrate-like sample such as a semiconductor wafer is mounted.

In manufacturing processes of forming a circuit of a semiconductor device on a sample such as a semiconductor wafer, a dry etching is performed to etch a film structure which is formed with a plurality of film layers disposed in advance on the semiconductor wafer using a plasma. In general, a plasma processing apparatus of performing such a dry etching is provided with a vacuum chamber having a certain degree of vacuum to generate a plasma and is configured to place a sample such as a wafer inside a processing chamber as an interior space and supply a processing gas so as to generate the plasma, and to etch a thin film forming a circuit gate or an insulating layer in a film structure along a mask layer by using a reactive particle and a charged particle formed in the plasma.

A plasma processing apparatus according to the related art is provided with: a processing chamber disposed inside a vacuum chamber in which a plasma is generated and a sample is placed; a gas supply device which is connected to the processing chamber and supplies a processing gas into the processing chamber; a vacuum pumping apparatus such as a turbo molecular pump which maintains pressure inside the processing chamber to a certain value; a sample stage which chucks and holds a semiconductor wafer, as a member to be processed, mounted onto the sample stage, using static electricity; a plasma generating device which supplies an electric field or a magnetic field for generating a plasma in the processing chamber; or the like. When particles of the processing gas supplied through an induction hole disposed on a ceiling surface of the processing chamber by the electric field or the magnetic field supplied by the plasma generating device excite to generate a plasma, an interaction occurs between a reactive particle in the plasma and a material of a film structure of a wafer surface thereby proceeding an etching process.

In recent years, along with an improvement of an integration degree of a semiconductor device, a demand increases for implementing a further fine process with higher accuracy, that is, improvement in the processing accuracy, and further, a demand increases for a process with higher throughput even when a film layer to be processed is etched at plural steps. In order to cope with such demands, it is required to realize an optimal processing condition in a short period of time during each etching at each of the plural steps, for example, to realize an optimal temperature of the wafer. In order to realize the optimal temperature without impairing throughput at the plural steps employed in different conditions, a configuration to change the temperature of the wafer or the sample stage on which the wafer is mounted in a short period of time to perform adjustment with favorable accuracy is necessary.

In order to change the temperature of the wafer in a short period of time, it is effective to reduce thermal capacity of an upper part of the sample stage on which the wafer is mounted as small as possible. For this, it is considered to shorten a distance between atop surface of the sample stage to be in contact with the wafer and a temperature adjustment unit such as a heater disposed in the sample stage to adjust temperature of the wafer or the sample stage, or a flow path to flow a heat exchange medium, or to increase efficiency in heat transfer between the wafer and the temperature adjustment unit by reducing the number of components configuring the upper part.

In a plasma processing apparatus of the related art, as a unit to achieve such an object, it has been considered to supply high-frequency power to a film-like electrode to which DC power is supplied to electrostatically chuck the wafer so as to form a bias potential on the wafer. As an example of the related art, JP-A-6-45285 has been known. In the related art, a plasma processing apparatus is disclosed in which a film-like electrode for electrostatic chuck disposed in a sample stage is divided into a plurality of electrodes when viewed from above and a voltage value of high-frequency power supplied to the plurality of electrodes is adjusted so as to decrease a variation in distribution of processing speed or a shape after processing in a direction of a top surface of the wafer, thereby allowing a variation in characteristics of an etching process to be within a predetermined range.

SUMMARY OF THE INVENTION

However, such a plasma processing apparatus of the related art, there is a problem since the following aspects have not been fully considered.

In other words, in the related art, not only a high voltage but also a great deal of current, compared to a conventional level, flows in order to supply a DC voltage and the high-frequency power (AC voltage) to the film-like electrode for the electrostatic chuck. Therefore, the electrode generates a great amount of heat due to the current so that a variation in distribution of temperature of the wafer becomes great.

Therefore, in the related art, it is difficult to realize a processing condition to have a desired value so that a yield ratio of processing the wafer is impaired. The object of the present invention is to provide a plasma processing apparatus with an improved yield ratio of the process.

According to such an object, provided is a plasma processing apparatus which processes a sample mounted on a sample stage using a plasma formed inside a processing chamber. In the configuration, the sample stage includes a dielectric film disposed on a top surface of a substrate and formed by thermal spraying, and a sintered plate which is bonded with the dielectric film interposing an adhesive at an upper side of the dielectric film and has a film-like electrode therein to which high-frequency power is supplied. A connector section with the film-like electrode to which the high-frequency power is supplied includes a conductor section which is disposed inside a through hole, an upper part of which is bonded to the film-like electrode and a lower part of which is connected to an end of a power supply path of the high-frequency power, and a boss which is disposed between the conductor section and the substrate surrounding an outer periphery of the conductor section inside the through hole and made of an insulating material. Upper ends of a rod-like member at the center of the conductor section and a socket surrounding the rod-like member are disposed at a position higher than the boss, and an adhesive is prevented from entering between the socket and the rod-like member in the upper end of the socket.

Thus, embodiments can comprise a plasma processing apparatus having a processing chamber disposed inside a vacuum chamber and an inside thereof is depressurized; and a sample stage disposed inside the processing chamber and on which a sample as a processing target is mounted and electrostatically chucked. The plasma processing apparatus processes the sample using a plasma generated inside the processing chamber, and the sample stage includes a substrate which is constituted by metal configured to be at aground potential, a dielectric film disposed on a top surface of the substrate and formed by thermal spraying, a sintered plate which is bonded with the dielectric film interposing an adhesive at an upper side of the dielectric film and has a film-like electrode therein to which high-frequency power is supplied, and a center conductor which is disposed inside a through hole disposed inside the substrate, and supplies the high-frequency power being electrically connected to the film-like electrode. The center conductor which is disposed inside the through hole comprises an upperpart which is bonded to the film-like electrode and a lower part of which is connected to an end of a power supply path of the high-frequency power, and a boss which has a cylindrical shape and is disposed between the center conductor and the substrate surrounding an outer periphery of the center conductor inside the through hole and made of an insulating material. An upper end of a boundary between the substrate and the boss, and an upper end of the boss, are covered with the dielectric film, and the center conductor includes a central part which has a rod-like shape having an upper portion thereof connected to the film-like electrode inside the sintered plate, and a socket part that is conductive which is disposed under the sintered plate and is connected to the central part and the power supply path, and an upper portion of the conductive socket has a tubular shape surrounding the rod-like shaped portion of the central part between the rod-like shaped portion and the boss. The rod-like shaped portion of the central part is disposed inside an upper end portion of the tubular shaped portion of the conductive socket with a gap between the rod-like shaped portion of the central part and the upper portion of the conductive socket, a lower portion of the conductive socket is connected to a lower portion of the central part below the gap of the tubular shaped portion, and a position of an upper end of the tubular shaped portion of the conductive socket in the vertical direction is positioned between the upper end of the boss and the sintered plate in a state where the sintered plate is bonded onto the dielectric film. The upper end of the conductive socket is disposed at a distance in the vertical direction with respect to the top surface of the substrate such that distribution of intensity of electric field when high frequency power is supplied to the film-like electrode can be adjusted.

According to the present invention, it is possible to eliminate an abnormal heat generation by mitigating a strong electric field of adhesive inside a power supply section to which high-frequency power is applied so as to eliminate a wafer hotspot thereby preventing a device failure caused by a temperature factor around the power supply section.

Other objects, features and advantages of the invention will become apparent from the following description of the embodiments of the invention taken in conjunction with the accompanying drawings.

DETAILED DESCRIPTION OF THE EMBODIMENTS

Figure 1:
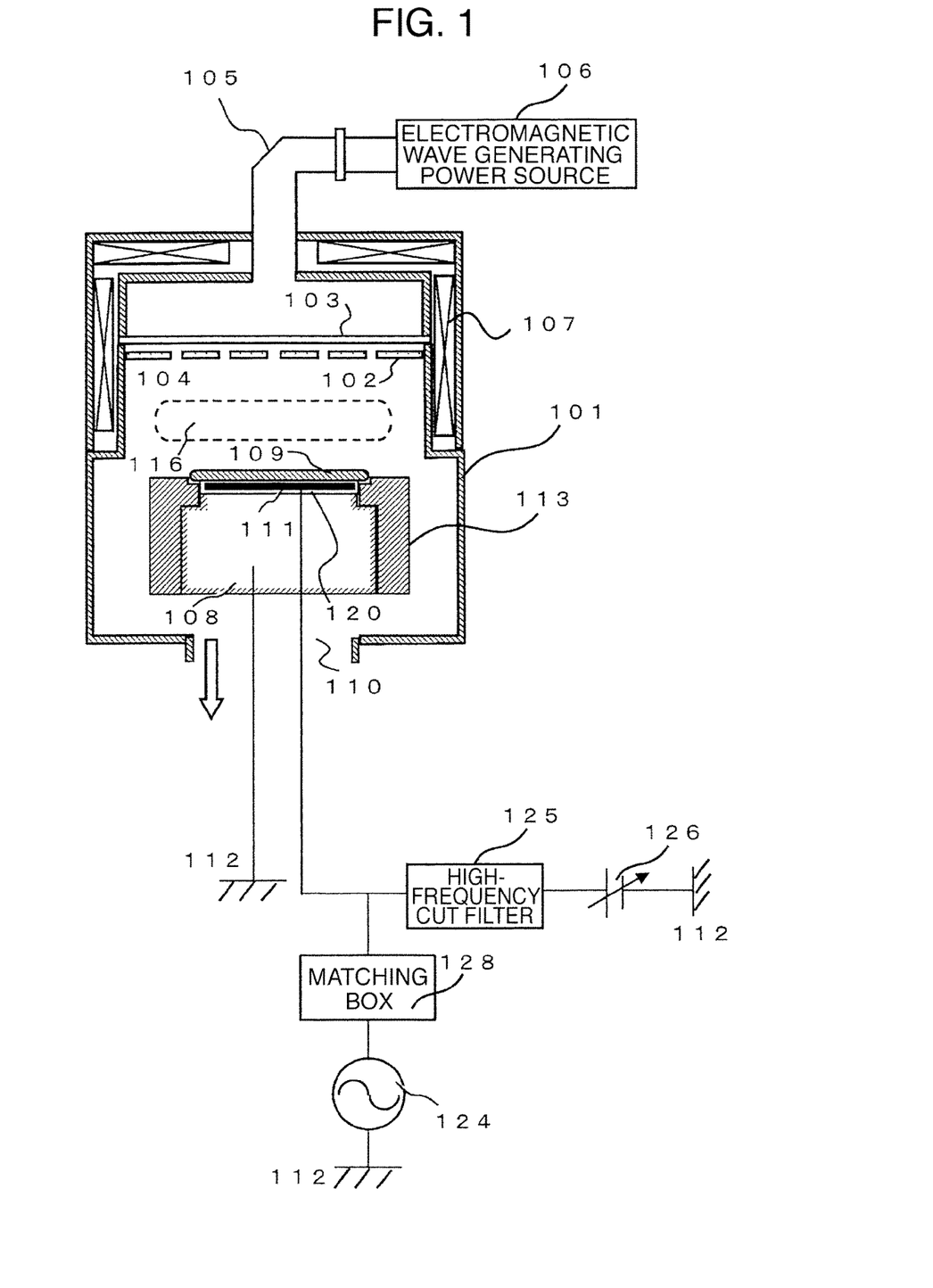
FIG. 1 is a vertical cross-sectional view that schematically illustrates an outline of a configuration of a plasma processing apparatus according to an embodiment of the present invention.

Hereinafter, an embodiment of the present invention will be described with reference to the drawings.
First Embodiment Hereinafter, an embodiment of the present invention will be described with reference to FIG. 1. FIG. 1 is a vertical cross-sectional view that schematically illustrates an outline of a configuration of a plasma processing apparatus according to the embodiment of the present invention. In particular, in this example, described is an apparatus which performs an etching process of a sample such as a semiconductor wafer as a processing target using electron cyclotron resonance (ECR) according to microwave, as a plasma generating unit.

A vacuum chamber 101 is configured such that a dielectric window 103 having a disc shape and made of a dielectric material such as quartz through which an electric field of microwave transmits is mounted to an upper end of a cylindrical member in an upper part of the vacuum chamber 101. The inside and outside of the vacuum chamber is air-tightly sealed. A cylindrical processing chamber 104, in which a wafer 109 as a member to be processed such as a semiconductor wafer is disposed and a plasma 116 is generated, is formed inside the sealed vacuum chamber.

In addition, a vacuum pumping apparatus (not illustrated) is connected to a lower side of the vacuum chamber 101 via a vacuum exhaust port 110 communicating with the processing chamber 104. A waveguide 105 disposed above the dielectric window 103 and in which the electric field of microwave propagates, an electromagnetic wave generating power source 106 such as a magnetron disposed at an end of the waveguide 105, and a coil 107 for generating a magnetic field which is disposed covering an upper side of the dielectric window 103 and surrounding sides of the vacuum chamber are provided in an upper side of the vacuum chamber 101. A shower plate 102 made of quartz in which a plurality of through holes, through which gas for the etching process is introduced into the processing chamber 104 disposed below, is disposed in a disc-shaped center portion is provided at a position below the dielectric window 103, that is, a position forming a ceiling surface of the processing chamber 104.

The electric field which is oscillated and formed by the electromagnetic wave generating power source 106 propagates inside the waveguide 105 disposed above the dielectric window 103 and is introduced into the processing chamber 104 so as to cause the processing gas inside the processing chamber 104 to be excited, thereby generating the plasma 116. Although there is no particular limitation on frequency of the electric field, the microwave of 2.45 GHz is used in this embodiment. A magnetic field supplied into the processing chamber from the coil 107 for generating a magnetic field which is disposed at an outer periphery of the sides of the cylindrical processing chamber 104 and at upper outside of the ceiling surface to form the magnetic field is adjusted to an intensity capable of forming ECR by an interaction with the electric field of 2.45 GHz so that the plasma 116 having high density is generated in the processing chamber 104.

In addition, a wafer mounting electrode (that is, a sample stage having an electrode therein) 108 is provided, that is, the sample stage whose top surface is disposed in the opposite to the dielectric window 103, below a space in which the plasma 116 is generated inside the processing chamber 104. The wafer mounting electrode 108 includes a metal substrate having a disc or cylindrical shape therein, and atop surface thereof is covered with a dielectric film 120 made of ceramics such as alumina and yttria. The wafer 109 as the sample to be processed is mounted on the top surface of the dielectric film 120 formed substantially in a circular shape in accordance with the wafer 109. Incidentally, a cylindrical susceptor 113 made of a dielectric material such as quartz is disposed along the outer periphery of side walls of the wafer mounting electrode 108 surrounding the wafer mounting electrode 108 in order to cope with the case in which the wafer mounting electrode 108 interacts with particles having high reactivity in the plasma or the processing gas, or the case in which byproducts generated during the process of the wafer 109 adheres.

A plurality of conductive films 111 is disposed inside the dielectric film 120 so as to form electrostatic force for electrostatically chucking the wafer 109, and DC power is supplied thereto from a DC power source 126 which is electrically connected via a high-frequency cut filter 125. In this embodiment, a high-frequency power source 124 is electrically connected via a matching box 128 to the power supply path between the high-frequency cut filter 125 and the conductive film 111. According to such a configuration, the high-frequency power is supplied to the conductive film 111 for the electrostatic chuck during the process of the wafer 109 so that a bias potential having a potential difference with respect to a potential of the plasma 116 generated inside the processing chamber 104 above the wafer 109 is formed on the wafer 109.

When only the DC power for the electrostatic chuck is supplied from the DC power source 126 to the conductive film 111, most of current which is to flow to the substrate of the wafer mounting electrode 108 is blocked by the dielectric film 120. On the other hands, in the configuration according to this embodiment in which current of the high-frequency power is supplied to the conductive film 111 from the high-frequency power source 124, a high current easily flows to the substrate passing the dielectric film 120.

A sensor such as a temperature sensor (not illustrated) of detecting temperature of the substrate or a position sensor (not illustrated) of detecting a position of a lifting pin vertically moving the wafer 109 above the dielectric film 120 is disposed on the substrate of the wafer mounting electrode 108. There is a risk that such a sensor malfunctions under the condition in which electrical noise frequently occurs to inhibit a proper process of the wafer 109. In addition, in general, a coolant flow path is disposed inside the substrate of the wafer mounting electrode 108, in which a heat exchange medium (coolant) flows so as to remove heat received from the plasma 116 through the wafer 109, or the heat from a heater (not illustrated) when the heater is built in the substrate of the wafer mounting electrode 108 so as to control the temperature to be suitable for processing the wafer 109, that is, to perform cooling. Although not illustrated in FIG. 1, the coolant to be supplied to the coolant flow path in the substrate is also charged with static electricity when a high current is supplied to the substrate and disposed inside the electric field.

Such a coolant also causes the malfunction of the sensor, and eventually an unfavorable process of the wafer 109. Thus, in the embodiment, the substrate of the wafer mounting electrode 108 is electrically connected to the ground 112 to be a ground potential as illustrated in FIG. 1.

In the embodiment, the wafer mounting electrode 108 is disposed in the center portion of the processing chamber 104 in the vertical direction, and the processing gas is supplied downward to an upper space of the processing chamber to generate the plasma 116. Particles of a part not processed by the processing gas or the plasma 116, or of the byproducts formed during the process, pass a space between an inner wall of the processing chamber 104 of the wafer 109 and an outer wall of the wafer mounting electrode 108 to flow into a space below the wafer mounting electrode 108. Furthermore, the vacuum exhaust port 110 is provided in a cylindrical projection region (right below) downward of the wafer mounting electrode 108, that is, a bottom surface of the processing chamber 104 in order to discharge the particles inside the processing chamber 104. In the embodiment, the inside of the processing chamber 104 is configured to be exhausted by operation of a vacuum pump communicated with the vacuum exhaust port 110 thereby allowing depressurization.

The wafer 109, which is not processed and mounted on a robot arm for conveyance provided inside another vacuum chamber (not illustrated) connected with a side wall of the vacuum chamber 101, is carried to the inside of the processing chamber 104 by extension of the arm and handed over to the wafer mounting electrode 108. The wafer 109 mounted on the dielectric film 120 on atop surface of the wafer mounting electrode 108 is chucked onto the dielectric film 120 to be held by electrostatic force which is formed using a DC voltage applied to the conductive film 111 from the DC power source 126.

In this state, the processing gas for etching is supplied from the gas source (not illustrate) and adjusted in flow rate by a mass flow controller (not illustrated). After passing through a gas supply pipe line, the gas is introduced into a gap between the dielectric window 103 and the shower plate 102 in the vacuum chamber 101 and diffused inside the gap, and then passes through the through hole of the shower plate 102 to be introduced into the processing chamber 104 from above. After the inside of the processing chamber 104 is exhausted by the operation of the vacuum pump, and a state, in which pressure of the processing chamber 104 becomes a value within a range suitable for the process according to the balance between the introduction rate of the processing gas and the exhaust rate of the gas and particles inside the processing chamber 104 through the vacuum exhaust port 110, is detected by a control device (not illustrated), the electric field or the magnetic field is supplied into the processing chamber 104 to generate the plasma 116.

When the high-frequency power is supplied for forming a radio frequency (RF) bias onto the wafer 109 from the high-frequency (or radio frequency) power source 124 electrically connected to the conductive film 111 in the dielectric film 120 of the wafer mounting electrode 108 in a state in which the plasma 116 is generated, the charged particles such as ions inside the plasma 116 are attracted toward the wafer 109 from the plasma 116 according to a potential difference between the bias potential and the potential of the plasma 116 and collided with the film structure formed on the top surface of the wafer 109 thereby initiating the process. In other words, a reaction between the reactive particles of the plasma 116 or the processing gas and the film material to be processed of the film structure on the wafer 109 is accelerated using energy generated by such collision of the charged particles so that the etching process proceeds. A part of the gas not supplied for the process and the byproducts generated during the process join the flow of the processing gas as described above to be carried below the wafer mounting electrode 108 and discharged to the outside of the processing chamber 104 through the vacuum exhaust port 110.

Figure 2:
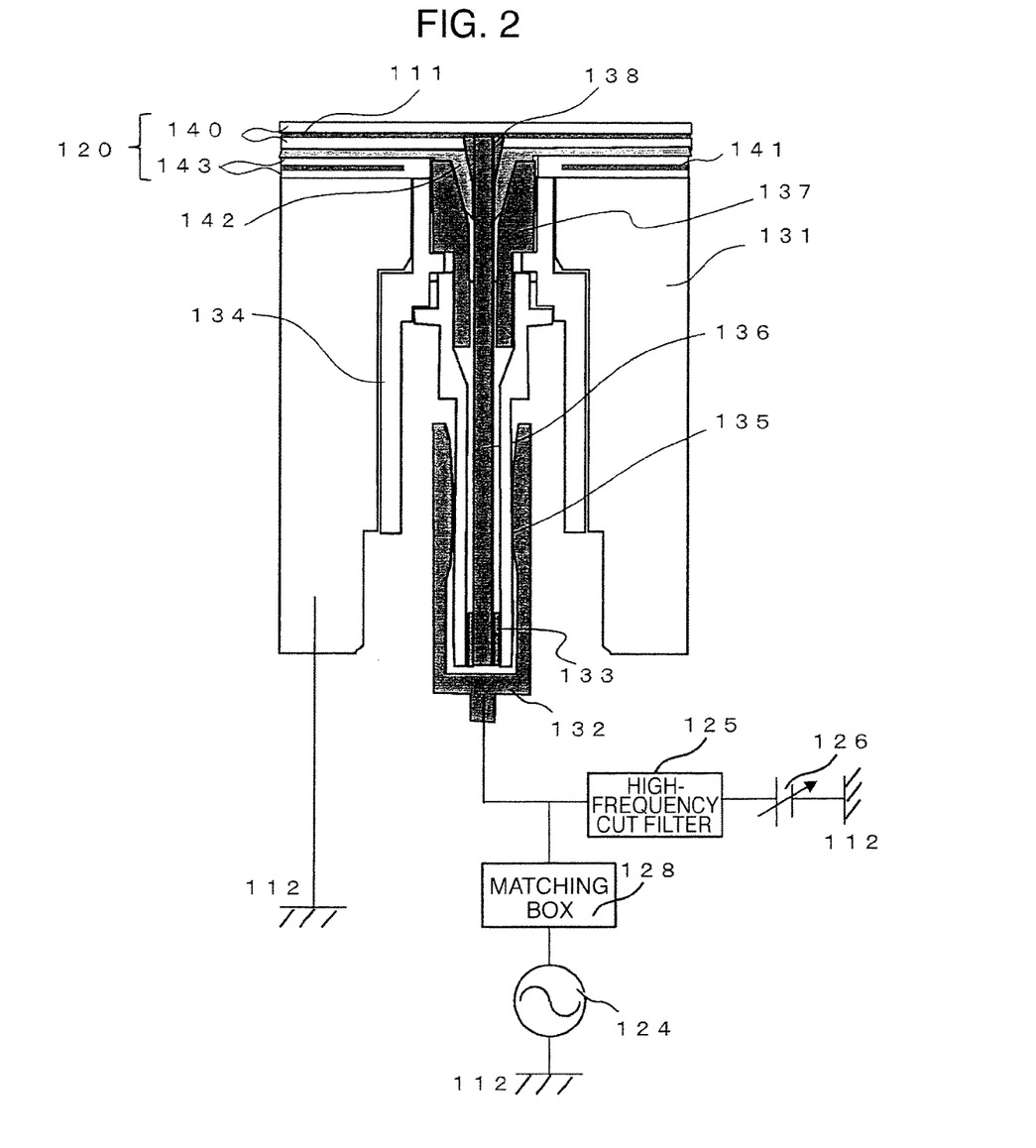
FIG. 2 is an enlarged vertical cross-sectional view that illustrates a configuration of a power supply section of an electrode for mounting a wafer according to the embodiment illustrated in FIG. 1.

A power supply section of the electrode according to the embodiment will be described with reference to FIG. 2. FIG. 2 is an enlarged vertical cross-sectional view that illustrates a configuration of the power supply section of the wafer mounting electrode according to the embodiment illustrated in FIG. 1. FIG. 2 is a diagram that enlarges and illustrates the wafer mounting electrode 108 of FIG. 1 focusing on a connector in which the power supply path between the conductive film 111 and the high-frequency power source 124 electrically connected to the conductive film 111 or a DC power source 126 is connected to the conductive film 111. Only a part of each of the dielectric film 120, the conductive film 111, and the substrate 131 of electrode head, provided around the connector section is illustrated, and an each edge thereof illustrated by a solid line in the figure does not indicate a real outer peripheral edge of each member.

In the embodiment, it is configured such that a sintered plate 140 which includes the conductive film 111 therein and serves a function as both the electrode for electrostatic chuck and an electrode for forming a high-frequency bias potential is bonded onto an insulating film 143 which is formed by thermal spraying of an dielectric material and includes a heater film 141 with an adhesive 142 interposed therebetween. As illustrated in FIG. 1, the voltage of the DC current output from the DC power source 126 is introduced to the conductive film 111 via the high-frequency cut filter 125. In addition, the high-frequency power generated from the high-frequency power source 124 is introduced to the conductive film 111 via the matching box 128.

The above-described DC power and the high-frequency power are superimposed at a position closer to the wafer mounting electrode 108 than the high-frequency cut filter 125 on the power supply path and pass through the power supply path to be supplied to the conductive film 111. In other words, the superimposed high-frequency power and DC power pass through a power supply receptacle 132, then pass through a center conductor 136 connected with a lower end portion of a socket 135 by a solder 133 via the socket 135 contacting the power supply receptacle 132, and are supplied to the conductive film 111 bonded to an upper end of the center conductor 136 by a solder 138

The DC power voltage applied to the conductive film 111 causes electric charge to be accumulated between the conductive film 111 and the wafer 109 mounted on the conductive film 111 with the dielectric film 120 interposed therebetween, to form static electricity so that the wafer 109 is electrostatically chucked. In addition, the high-frequency power transmitted to the center conductor 136 and the conductive film 111 passes through the dielectric film 120 to form the bias potential (not illustrated) on the wafer 109. In the related art, only the DC power is supplied to the conductive film 111, and accordingly, the dielectric film 120, that is, an insulator functions as a capacitor with respect to the wafer so that even voltage occurs, current hardly flows to the wafer 109 and the substrate 131 of electrode head.

However, in the embodiment, the high-frequency power is supplied to the conductive film so that the capacitor is regarded as a certain impedance to allow the current according to the high-frequency power to easily flow even to the substrate 131 of electrode head. In such a case, the current flows also to the power supply path.

The power supply section, which connects the power supply path including such a connector and the conductive film 111, is a section provided in the substrate 131 of electrode head which is cooled by the coolant. The section floats in vacuum or, in the air, and is almost in an adiabatic state to become a point from which heat hardly releases so that a localized high temperature easily appears on a mounting surface of the wafer 109 formed by the dielectric film 120. Therefore, there is a risk of so-called singularity (hot spot). Therefore, a processed shape, as a result of the etching process, of a point of the wafer 109 right above the power supply section is different from that of another point, and accordingly a semiconductor device to be obtained thereafter is defective whose performance does not satisfy expectation so that a yield ratio of processing the wafer 109 is impaired.

Figure 3:
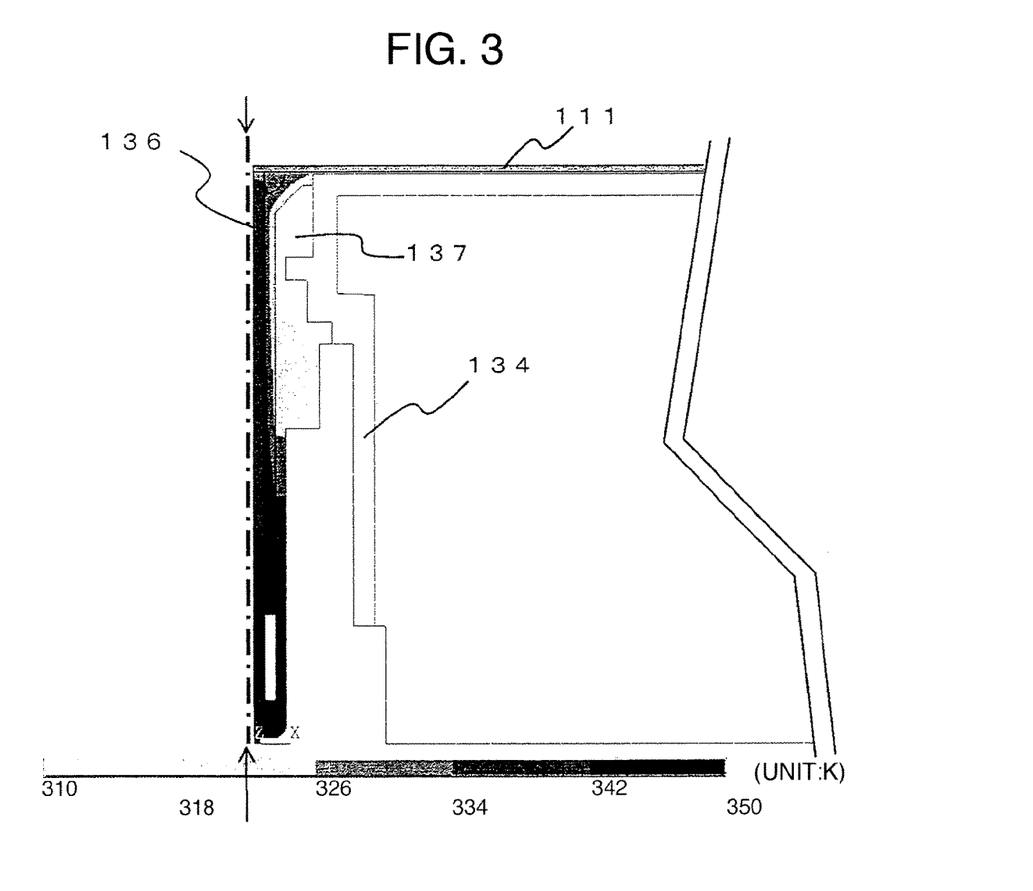
FIG. 3 is a diagram that illustrates the result obtained from numerical simulation of distribution of ambient temperature of the power supply section illustrated in FIG. 2.

The inventors have reviewed the distribution of temperature regarding on the power supply section in the state of being supplied with the high-frequency power in order to solve such a problem. The result thereof is illustrated in FIG. 3. FIG. 3 is a diagram that illustrates the result obtained from numerical simulation of distribution of ambient temperature of the power supply section illustrated in FIG. 2.

In FIG. 3, illustrated is the result that the temperature distribution is numerically calculated with respect to only the temperature at the right of the figure of the central axis in the vertical direction of the center conductor 136 of FIG. 2. As illustrated in FIG. 3, it is recognized that as the power supply section, and in particular, a part of the center conductor 136 deviates from the substrate 131 of electrode head, the temperature thereof increases. Incidentally, a part of the center conductor 136, at a lower part in the figure, whose distance from the substrate 131 of electrode head is far also deviates from the wafer 109 so that the influence on the wafer decreases. Therefore, it is important to suppress the heat generation near the wafer 109.

Figure 4:
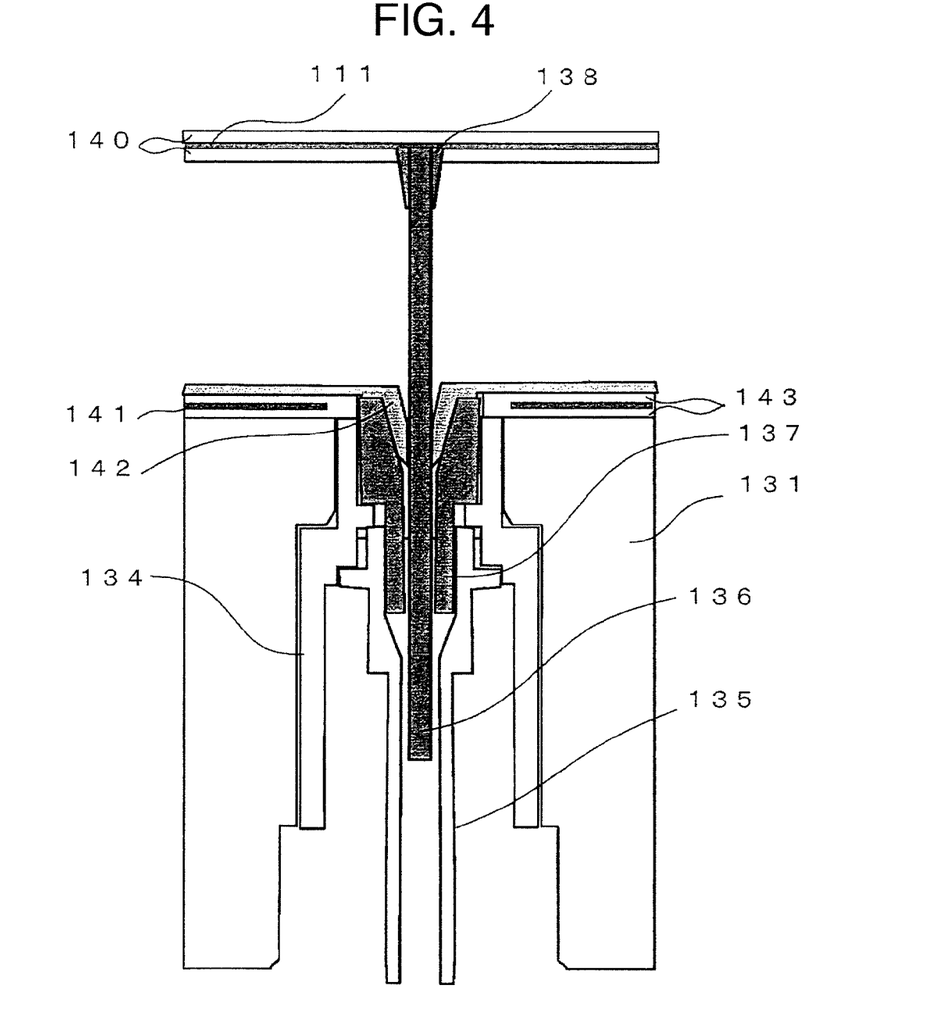
FIG. 4 is a vertical cross-sectional view that illustrates a state at a first stage to form the power supply section of the wafer mounting electrode according to the embodiment illustrated in FIG. 2.

As a solution, the embodiment is provided with a configuration to suppress a state in which the adhesive is disposed in a region where a relatively strong electric field is formed. Such a configuration will be described with reference to FIG. 4. FIG. 4 is a vertical cross-sectional view that illustrates a state at a first stage to form the power supply section of the wafer mounting electrode according to the embodiment illustrated in FIG. 2.

The surface of the dielectric film 120, which is to be in contact with the wafer 109, needs to have a high plasma resistance and be clean. In the embodiment, for example, the dielectric film is configured by the sintered plate 140 using a sintered body formed by firing ceramics such as alumina and yttria. When such a part to be in contact with the wafer 109 is configured by a film formed by thermal spraying, particles floating inside the processing chamber 104 is likely to enter and be chucked to a pore formed in the surface. In addition, since the film is composed of particles, the surface is easily deformed due to an interaction with the plasma 116, and there is a risk that contamination of the wafer 109 increases due to release of fine particles or fragments of adherend from the surface.

The sintered plate 140 is formed by being tired in a disc shape in a state having the conductive film 111 therein, and accordingly it is preferable that the both have similar sintering temperature. For example, a material such as tungsten is used for the conductive film 111. The center conductor 136 is connected through a hole disposed in the sintered plate-like sintered plate 140 to the conductive film 111 to be an integrated member by bonding using the solder 138.

In addition, the part of the dielectric film 120 which is not in contact with the wafer 109 by being disposed on the conductive film 111 and covered with the sintered plate 140 at an upper side thereof may be formed by thermal spraying since the part is not in contact with the plasma. In the embodiment, the heater film 141 and the insulating film 143 are formed by thermal spraying. The reason of manufacturing the members by thermal spraying will be presented below.

An insulating boss 134 having a cylindrical shape and its outer shape is formed to be in close contact with a penetration hole formed in advance in the substrate 131 of electrode head is fitted into and bonded to the penetration hole to form the power supply section at the substrate 131 of electrode head side. At this time, an upper end of the insulating boss 134 has a surface shape to have substantially the same height with a top surface of the substrate 131 of electrode head.

A material such as ceramics is thermal sprayed onto both the upper end surface of the insulating boss 134 and the top surface of the substrate 131 of electrode head so that an interface between the insulating boss 134 and the substrate 131 of electrode head is covered by the insulating film 143 formed by the thermal spraying. Then, the heater film 141 is formed by thermal spraying and thereafter, the insulating film 143 is formed by additional thermal spraying of a material such as ceramics covering the heater film 141. According to such a configuration, the adhesive 142 is prevented from entering the gap between the insulating boss 134 and the substrate 131 of electrode head when the sintered plate 140 is bonded onto the insulating film 143 with the heater film 141 included therein.

A strong electric field is formed depending on a potential difference between the center conductor 136 to which a high voltage is applied by the high-frequency power and the substrate 131 of electrode head connected to the ground 112 to be the ground potential. Accordingly, when the high-frequency power is supplied to the conductive film 111 in a state where the sintered plate 140 and the insulating film 143 are bonded to each other with the adhesive interposed therebetween, the adhesive 142 is interposed in the part in which the strong electric field is formed. In the embodiment, it is desirable that the adhesive 142 have an insulation property, and the adhesive 142 made of such a material has a great dielectric loss in general to generate heat when the adhesive is exposed to a large electric field.

The heat generation and a parameter such as an intensity of an electric field have the following relationship. That is, the heat generation is proportional to a square of the intensity of the electric field (E/d), a frequency f a relative dielectric constant r, and a dielectric loss tan.

The dielectric loss tan of the adhesive 142 is relatively great compared to surrounding materials thereby becoming a heat generating source. In particular, since the center conductor 136 floats in vacuum or in the air so that the heat capacity thereof is small thereby becoming a factor forming a hot spot. Thus, in the embodiment, a tubular conductive socket 137 for control of the electric field is provided in a state where the power supply path is provided, which is disposed above the socket 135 made of a conductor and fitted to be in contact with an upper part of the socket 135.

The conductive socket 137 is made of a conductive material similarly to the socket 135 and is disposed surrounding an outer periphery of an upper part of the center conductor 136 as a rod-like member between each inner wall of the substrate 131 of electrode head and the insulating boss 134 and the upper part of the center conductor 136, similarly to the socket 135. In the embodiment, an outer periphery of a lower end portion of the conductive socket 137 and an inner peripheral wall of an upper end portion of the socket 135 are fitted to each other by a male screw and a female screw formed in advance to be one conductive member to transmit the high-frequency power. Further, a tubular structure is provided in which the center conductor 136 is disposed in the center portion of each tubular interior in the state where the sintered plate 140 is bonded onto the insulating film 143.

After the upper end surface of the insulating boss 134 is covered by the insulating film 143 along with the top surface of the substrate 131 of electrode head in the state where the insulating boss 134 is fitted into the penetration hole for incorporating the power supply section of the substrate 131 of electrode head, the conductive socket 137 is inserted from an upper side of the insulating boss 134 into the penetration hole inside the insulating boss 134 and its position in the vertical direction and the horizontal direction is determined. In this state, the lower end portion at which the male screw of the conductive socket 137 is formed protrudes downward inside the penetration hole in the insulating boss 134.

The socket 135 is inserted from a lower side of the penetration hole of the substrate 131 of electrode head for disposing the power supply section therein and the top of the socket 135 is fitted to the female screw formed in advance so that the both are integrally connected to each other. In this manner, the socket 135 and the conductive socket 137 are integrated and each position thereof is fixed interposing a flange portion protruding inwardly from the inner wall of the tubular insulating boss between the both sockets connected by the screw. The positions of the integrated sockets are fixed with respect to the substrate 131 of electrode head or the insulating boss 134 inside the substrate 131 of electrode head.

The lower end portion of the socket 135 having a circular tube shape and positioned at a lower side is bonded to a lower end portion of the center conductor 136 positioned at the center inside the tube by the solder 133 and the both are electrically connected to each other. In this state, there is a certain distance between an inner peripheral wall surface of the tube formed by the socket 135 and the conductive socket 137 and an outer peripheral wall of the rod-like center conductor 136. Thus, according to a tolerance at the time of manufacture, it is suppressed that the surfaces of the both are in contact so that distortion or an external force is applied thereto to cause damage or deformation even when there is a variation in the positions of the both.

An outer periphery of the socket 135 has a cylindrical shape, and an outer peripheral wall surface thereof is inserted into a recessed portion inside the power supply receptacle 132 electrically connected to the power supply path and having a cylindrical shape to be electrically connected to the power supply path. In more details, an inner diameter of a convex portion defined by a distal end of the ring-shaped convex portion protruding toward the center and formed in the inner peripheral wall of the recessed portion having an opening upwardly at an upper end of the power supply receptacle 132 is set to be equivalent to or slightly smaller than an outline of the outer peripheral wall surface of the lower part of the socket 135 so that the both surfaces may be reliably in contact with each other in the state the both are fitted to each other to be inserted.

In the embodiment, a configuration is provided in which the strong electric field near the center conductor 136 is mitigated by the conductive socket 137 has a dimension in which the upper end surface of the conductive socket 137 is disposed near the surface of the insulating film 143. The socket 135 and the conductive socket 137 may be connected by screwing, by bonding using a low melting point metal or by a conductive adhesive, and it is important that a potential of the conductive socket 137 is to be substantially the same potential with the socket 135.

In addition, it is height of the socket 135 that determines controllability of the electric field. Further as the socket 135 is close to an electrode sintered film, an effect of mitigating the electric field around the center conductor 136 is strong. A result from an electric field analysis is illustrated in FIGS. 5A to 5C in order to determine such a mitigation effect in detail.

Figure 5A:
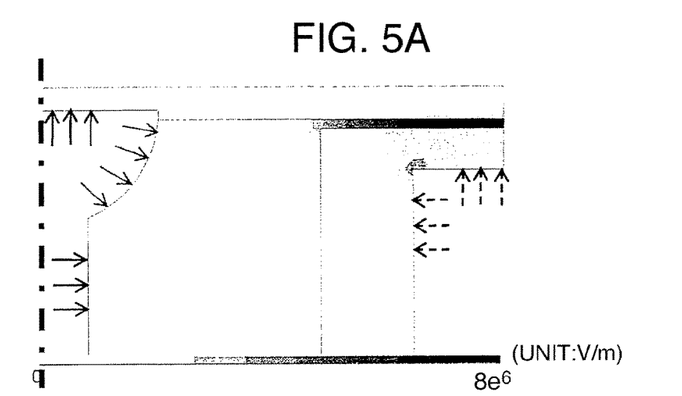
FIGS. 5A to 5C are diagrams that illustrate the result of simulation of distribution of intensity of an electric field surrounding the power supply section when high-frequency power is supplied to the power supply section of the embodiment illustrated in FIG. 2.
Figure 5B:
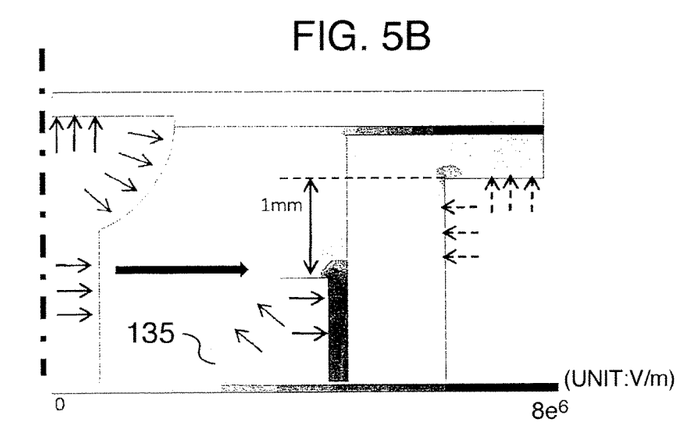
Figure 5C:
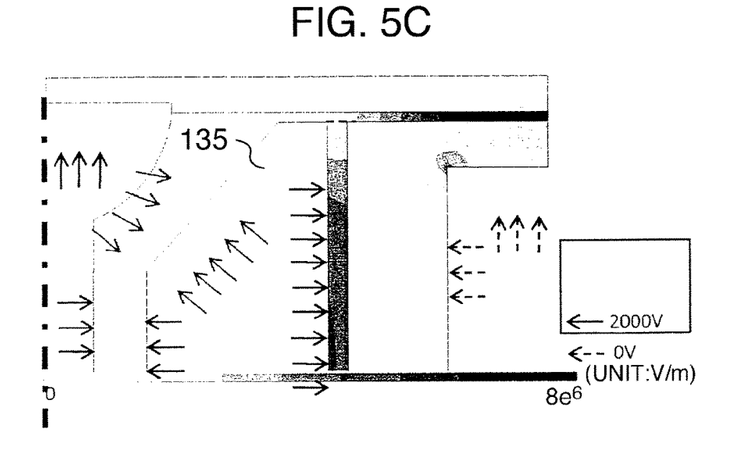

FIGS. 5A to 5C are diagrams that illustrate the result of simulation of distribution of intensity of the electric field surrounding the power supply section when the high-frequency power is supplied to the power supply section of the embodiment illustrated in FIG. 2. Every numerical width corresponding to a contour color of the analysis result is the same in FIGS. 5A to 5C, and the value thereof is 0 to 8 e6 (V/m).

From this result, a strong electric field occurs near a core wire as illustrated in FIG. 5A when the socket is not provided, and the core wire floating in vacuum or in the air becomes a hot spot. On the other hand, as illustrated in FIG. 5B, it is recognized that the electric field is mitigated when the height of the upper end of the socket 135 is set to be 1 mm below from a top surface of the electrode substrate.

Furthermore, as illustrated in FIG. 5C, it is recognized that the electric field is further mitigated when the height of the upper end of the socket 135 is set to be equal to the electrode substrate top surface. In this manner, it is founded that the electric field is sufficiently mitigated for practical use and the heat generation is suppressed by positioning the socket for controlling the electric field to be equal to or less than 1 mm below from the substrate top surface.

In addition, an interior has a shape recessed in a funnel shape in the upper end portion of the conductive socket 137 for controlling the electric field, and the gap between the center conductor 136 and the conductive socket 137 is formed such that a size (dimension of the gap) or a cross-sectional area of the gap in the horizontal direction becomes small downward with respect to the vertical axis of the center conductor 136 in the figure. It is possible to suppress the adhesive from flowing into the gap between the outer peripheral side wall of the conductive socket 37 and the insulating boss 134 surrounding the former, that is, the point at which a stronger electric field is formed by allowing the adhesive to easily flow inside the recessed portion formed in the funnel shape by providing the recessed portion having such a shape so that the amount of heat generated in the power supply section decreases.

In addition, instead of using the solder 133, the fixation by brazing may be employed by sandwiching and fixing a conductive wire by a mechanical screw fixation. Furthermore, the surrounding of the conductive socket 137 and the socket 135 is preferably subjected to plating using a material having a low electrical resistance.

Since the high-frequency power is supplied to the socket 135 and the conductive socket 137, and the high-frequency power propagates on the surface of those members according to a surface effect, it is possible to efficiently transmit power and to reduce the heat generation amount by lowering the resistance of the surface part. Thus, it is preferable that the plating using gold, silver, or Ni having a small electrical resistance be executed on the surface of the socket 135 and the conductive socket 137. In the embodiment, as the high-frequency power for forming a bias, the power having a value within a range of several tens of KHz to several hundreds of MHz is used. Since a surface thickness is equal to or shorter than 100 μm with such frequency, it is desirable that a thickness of the plating be a value within a range from 0.1 to 10 μm in consideration of ease of manufacture.

Furthermore, in the embodiment, the female screw to be engaged with the male screw, provided at the outer peripheral side of a distal end (lower end in the figure) portion of the conductive socket 137 connected being disposed above, is provided at the upper part inside the tube of the socket 135 having a tube shape in which cylinders each having a different diameter are continuous as the outline Furthermore, an inner wall of the tube below the female screw has a funnel shape whose diameter decreases downward in the figure, and the gap between the center conductor 136 and the socket 135 is formed such that a size (dimension of the gap) or a cross-sectional area of the gap in the horizontal direction becomes small downward with respect to the vertical axis of the center conductor 136 in the figure in the state where the center conductor 136 is disposed through the center inside of the socket 135 and the conductive socket 137.

The adhesive 142 flown into the recessed portion formed in the funnel shape at the upper part of the conductive socket 137 has a risk of flowing into the gap between an inner wall of the recessed portion and a side wall of the rod-like center conductor 136 and moving downward depending on its weight. In the embodiment of FIG. 2, the adhesive 142 is prevented from flowing further downward and suppressed from reaching a further below point by employing the configuration in which the cross-sectional area of the gap decreases downward according to the funnel-shaped inner wall inside the tube of the socket 135.

When the adhesive 142 reaches the solder 133 by which a lower end of the center conductor 136 and the socket 135 are connected, there is a risk that the solder receives a force caused by expansion of volume according to increase in temperature of the adhesive 142 so that a creep strain may occur. In the embodiment of FIG. 2, the configuration is provided in which the adhesive 142 is prevented and stopped from flowing between the adhesive 142 and the solder 133 so that the contact therebetween may not occur.

According to such a configuration, the solder 133 is prevented from damage by receiving a force so that the bonding between the socket 135 and the center conductor 136 may not be impaired. In addition, a Sn—Ni—Cu based material is used as a material for the solder 133 so as to set high fatigue resistance with respect to thermal stress. In the embodiment provided with such a configuration, the contact between the upper part of the solder 133 and the adhesive 142 is suppressed so that it is possible to set the fatigue life thereof to be about ten times compared to the related art.

In addition, since a gap not filled with the adhesive 142 is provided between the center conductor 136 and the socket 135, it is configured such that cleaning of the internal wall surface of the socket 135 and the outer peripheral wall surface of the center conductor 136 may be realized. Other than configuring the above-described funnel shape, a penetration hole by which the adhesive 142 is extracted from the inside may be disposed in the middle of the socket 135.

Figure 6:
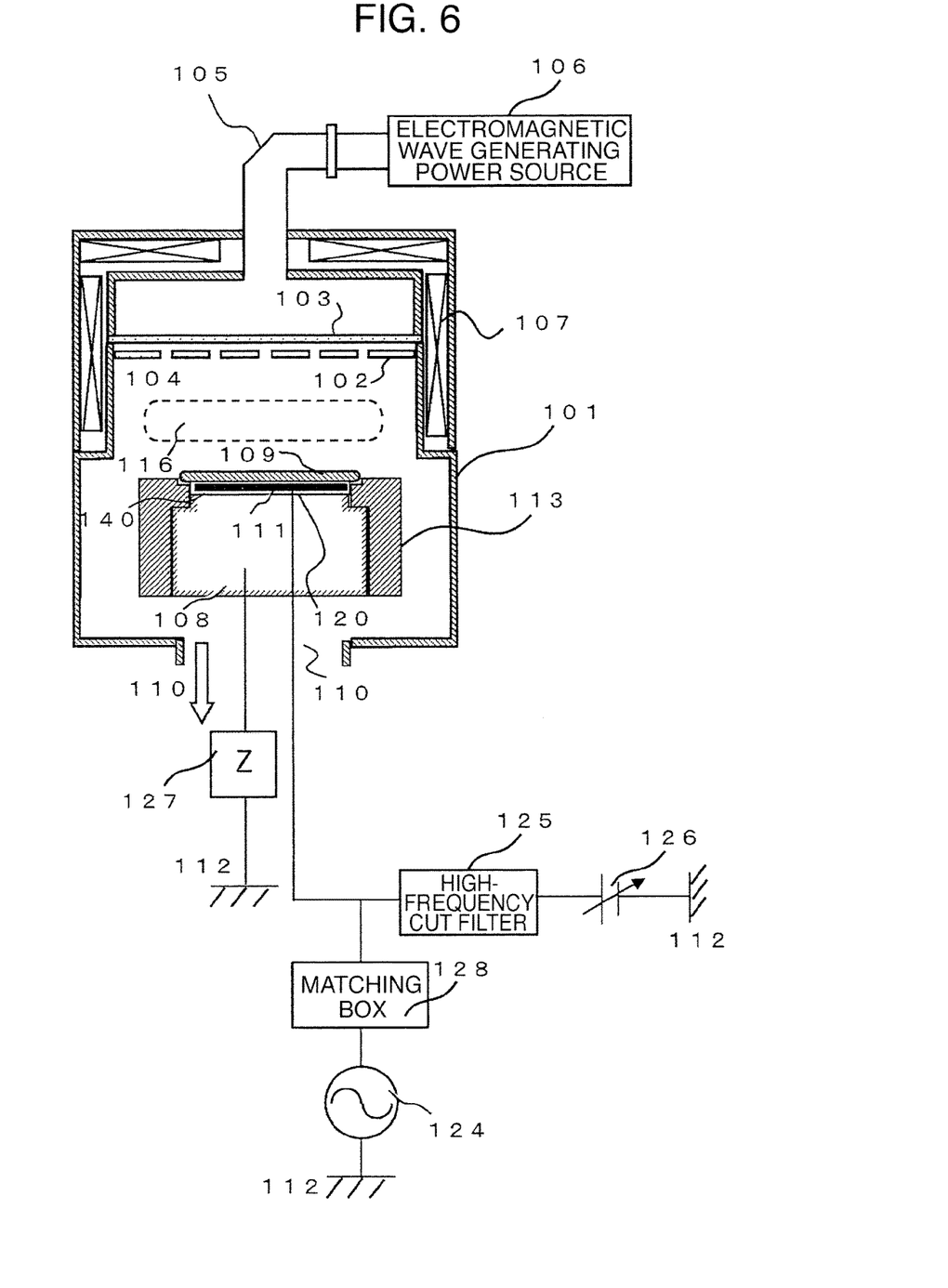
FIG. 6 is a vertical cross-sectional view that schematically illustrates an outline of a configuration of a plasma processing apparatus according to a modification of the embodiment illustrated in FIG. 1.

Although the substrate part of the wafer mounting electrode 108 is electrically connected to the ground 112 in the example of FIG. 1, the substrate part may be electrically connected to the ground 112 via an impedance element 127 as illustrated in FIG. 6. According to such a configuration, the charge by the high-frequency power is prevented to enable static protection of the coolant.

Furthermore, a configuration of the power supply section to the film-like electrode of the wafer mounting electrode 108 in a plasma processing apparatus according to another modification of the embodiment illustrated in FIG. 1 will be described with reference to FIG. 7 As described above, when the adhesive 142 bonding the sintered plate 140 with the insulating film 143 exists in a region in which a high electric field is formed in the wafer mounting electrode 108, it causes localized heat generation. Accordingly, in the embodiment, the power supply section is configured without using the adhesive as much as possible, as illustrated in FIG. 7

Figure 7:
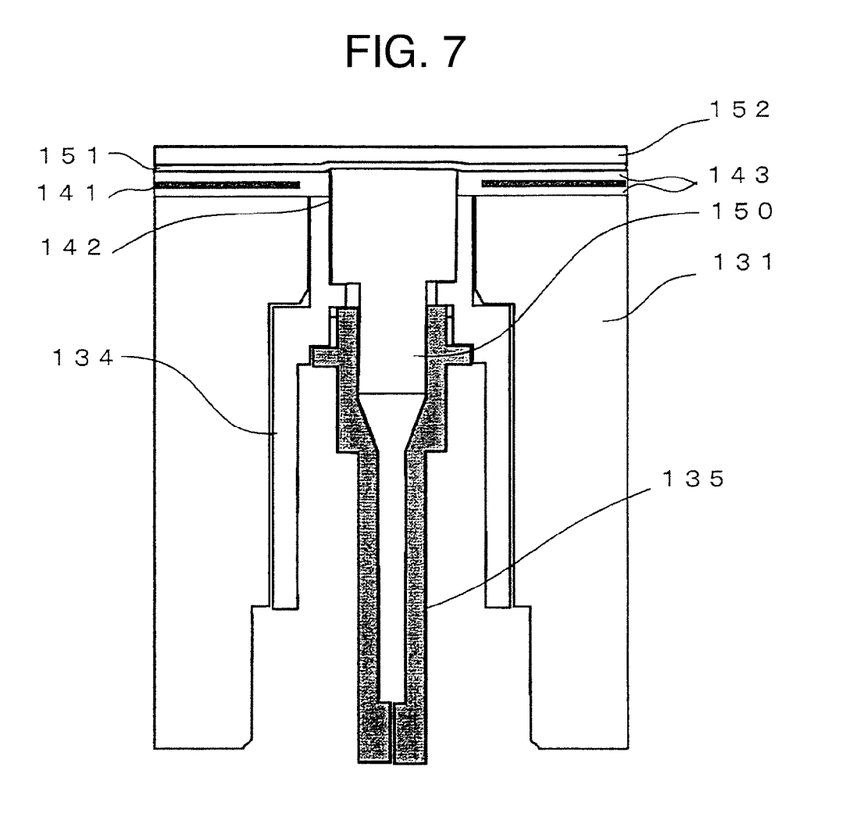
FIG. 7 is a vertical cross-sectional view that schematically illustrates an outline of a configuration of a power supply section to a film-like electrode of a wafer mounting electrode of a plasma processing apparatus according to another modification of the embodiment illustrated in FIG. 1.

In FIG. 7, the same reference numeral is given to the same component as in the embodiment illustrated in FIG. 2 or 4, and thus, the description thereof will not be provided unless it is necessary. The difference of the modification illustrated in FIG. 7 from the embodiment according to FIGS. 1 to 4 is that the heat generation is reduced by fitting a conductive boss 150 as a cylindrical member made of a conductive material in which two parts each having a different radius are continuous into the penetration hole of the insulating boss 134 from above to fix the position of the conductive boss 150, or by fixing the conductive boss 150 with the adhesive 142 interposed at a gap of equal to or less than 1 mm, a conductive film 151 is formed by thermal spraying on atop surface of the conductive boss 150 and the top surface of the insulating film 143, and then a sintered plate 152 is bonded onto atop surface of the conductive film 151 by an adhesive or the like.

In this example, it is desirable that positions of the circular top surface of the conductive boss 150 and the top surface of the insulating film 143 in height in the vertical direction be equal to each other or close to each other as much as being regarded to be equal. This is because the film may be formed by the thermal spraying without any break or gap when a difference in levels of the top surface of the conductive boss and the top surface of the insulating film 143 is great at the time of forming the conductive film 151 by covering the both using the thermal spraying. In this example, the difference in levels of the top surfaces thereof is preferably equal to or less than 0.5 mm. Incidentally, instead of the sintered plate 152, a film may be formed by thermal spraying using a dielectric or an insulating material.

When employing such a configuration, there is no need to bond the center conductor 136 and the conductive film 111 in the sintered plate 140 by the solder 138 and to insert the resultant into the socket 135 and the conductive socket 137 as in the embodiment illustrated in FIG. 2. There is no need to adopt a large gap for absorbing the deviation in positions of the both such as the gap between the center conductor 136 and the conductive socket 137 as illustrated in FIG. 2. Further, although the adhesive 142 is used for example, a use amount of the adhesive 142 may be a little since the gap may be formed smaller than that of the related art so that it is possible to suppress the heat generation due to the adhesive 142. The conductive socket 137 may be bonded to a bottom of the conductive boss 150 to have a bonded structure by screwing, by a conductive metallic adhesive or by a low melting point metal, or to be an integrated member In the above-described embodiment, a film as a target of the etching process is a silicon oxide film, and the above-described methane tetrafluoride gas, oxygen gas, methane trifluoride gas is used as an etching gas or cleaning gas, for example. However, the same effect may be obtained not only in the silicon oxide film, as a material to be etched, but also in a polysilicon film, a photoresist film, an organic antireflection films, an inorganic antireflection films, an organic material, an inorganic material, a silicon oxide film, a silicon nitride oxide film, a silicon nitride film, a Low-k material, a High-k material, an Amorphous carbon film, a Si substrate, a metal plate or the like. In addition, as the gas for etching, for example, chlorine gas, hydrogen bromide gas, methane tetrafluoride gas, methane trifluoride, difluoride methane, argon gas, helium gas, oxygen gas, nitrogen gas, carbon dioxide, carbon monoxide, hydrogen, ammonia, octafluoro propane, nitrogen trifluoride, sulfur hexafluoride gas, methane gas, silicon tetrafluoride gas, silicon tetrachloride gas, chlorine gas, hydrogen bromide gas, helium gas, neon gas, krypton gas, xenon gas, radon gas, or the like may be used.

In addition, in the above-described embodiment, an apparatus of performing the etching process using microwave ECR discharge has been described. However, the same effect may be obtained when the present invention is applied in an etching apparatus using another type of discharge (effective magnetic field UHF (Ultra High Frequency) discharge, capacitance-coupled discharge, induction-coupled discharge, magnetron discharge, surface-wave excitation discharge, transfer-coupled discharge or the like). In addition, in the above-described embodiment, an etching apparatus has been described, but the same effect may be obtained when the present invention is applied in another type of a plasma processing apparatus for performing a plasma process, for example, a plasma chemical vapor deposition (CVD) apparatus, an ashing apparatus, a surface modification apparatus or the like.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:
1. A plasma processing apparatus comprising:
a processing chamber that is disposed inside a vacuum chamber and an inside thereof is depressurized; and
a sample stage that is disposed inside the processing chamber and on which a sample as a processing target is mounted and electrostatically chucked,
the plasma processing apparatus which processes the sample using a plasma generated inside the processing chamber,
wherein the sample stage includes a substrate which is constituted by metal configured to be at a ground potential, a dielectric film disposed on a top surface of the substrate and formed by thermal spraying, a sin- tered plate which is bonded with the dielectric film interposing an adhesive at an upper side of the dielectric film and has a film-like electrode therein to which high-frequency power is supplied, and a center conductor which is disposed inside a through hole disposed inside the substrate, and supplies the high-frequency power being electrically connected to the film-like electrode, wherein the center conductor which is disposed inside the through hole comprises an upper part which is bonded to the film-like electrode and a lower part which is connected to an end of a power supply path of the high-frequency power, and a boss which has a cylindrical shape and is disposed between the center conductor and the substrate surrounding an outer periphery of the center conductor inside the through hole and made of an insulating material, wherein an upper end of a boundary between the substrate and the boss, and an upper end of the boss, are covered with the dielectric film, wherein the center conductor section includes a central part which has a rod-like shape having an upper portion thereof connected to the film-like electrode inside the sintered plate, and a socket part that is conductive is disposed under the sintered plate and is connected to the central part and the power supply path, and an upper portion of the conductive socket has a tubular shape surrounding the rod-like shaped portion of the central part between the rod-like shaped portion and the boss, the rod-like shaped portion of the central part is disposed inside an upper end portion of the tubular shaped portion of the conductive socket with a gap between the rod-like shaped portion of the central part and the upper portion of the conductive socket, a lower portion of the conductive socket is connected to a lower portion of the central part below the gap of the tubular shaped portion, and a position of an upper end of the tubular shaped portion of the conductive socket in the vertical direction is positioned between the upper end of the boss and the sintered plate in a state where the sintered plate is bonded onto the dielectric film, and wherein the upper end of the conductive socket is disposed at a distance in the vertical direction with respect to the top surface of the substrate such that distribution of intensity of electric field, when high-frequency power is supplied to the film-like electrode, can be adjusted.

2. The plasma processing apparatus according to claim 1, wherein the adhesive is disposed in the gap between the rod-like shaped portion of the central part and the conductive socket.

3. The plasma processing apparatus according to claim 1, wherein the substrate is grounded through an impedance element.

4. The plasma processing apparatus according to claim 1, wherein the distance in the vertical direction between the upper end of the conductive socket and the top surface of the substrate is in a range from 0 to 1 mm.

5. The plasma processing apparatus according to claim 1, wherein the rod-like shaped portion of the central part and the conductive socket are connected by a solder containing Sn, Ni, and Cu.

6. The plasma processing apparatus according to claim 1, wherein an inner wall surface of an upper end portion of the conductive socket surrounding the rod-like shaped portion of the central part having the gap therebetween has a funnel shape in which a size of the gap becomes narrow downward.

7. The plasma processing apparatus according to claim 1, wherein the conductive socket has a gold plate to cover a surface of the conductive socket.

8. The plasma processing apparatus according to claim 7, wherein a thickness of the gold plate is in a range from 0.1 to 10 μm.

9. The plasma processing apparatus according to claim 1, wherein DC power is applied to electrostatically chuck the sample to the film-like electrode, and then, the high-frequency power is supplied to process the sample.

* * * * *